United States Patent
O'Donnell et al.

(10) Patent No.: US 7,861,132 B1
(45) Date of Patent: Dec. 28, 2010

(54) ADAPTIVE ERROR CORRECTION

(75) Inventors: Laura J. O'Donnell, El Segundo, CA (US); Hans M. Hagberg, Redondo Beach, CA (US); Michael A. Gorman, Lakewood, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 398 days.

(21) Appl. No.: 10/993,656

(22) Filed: Nov. 19, 2004

(51) Int. Cl.
*H03M 13/00* (2006.01)

(52) U.S. Cl. .................. 714/755; 714/712; 714/752; 714/774

(58) Field of Classification Search ......... 714/704–708, 714/774, 776, 755; 370/468, 316, 226, 315, 370/326–329
See application file for complete search history.

(56) References Cited

U.S. PATENT DOCUMENTS

| | | | | |
|---|---|---|---|---|
| 4,744,083 A * | 5/1988 | O'Neill et al. | ............... | 714/704 |
| 4,839,656 A * | 6/1989 | O'Neill et al. | .......... | 342/357.01 |
| 5,511,079 A * | 4/1996 | Dillon | ......................... | 714/774 |
| 5,600,663 A | 2/1997 | Ayanoglu et al. | | |
| 5,615,221 A | 3/1997 | Karp et al. | | |
| 5,699,365 A | 12/1997 | Klayman et al. | | |
| 5,721,742 A * | 2/1998 | Okajima et al. | ............. | 714/751 |
| 6,044,485 A | 3/2000 | Dent et al. | | |
| 6,122,293 A | 9/2000 | Frodigh et al. | | |
| 6,314,535 B1 | 11/2001 | Morris et al. | | |
| 6,487,251 B1 * | 11/2002 | Antia et al. | .................. | 375/259 |
| 6,614,804 B1 * | 9/2003 | McFadden et al. | .......... | 370/468 |
| 6,678,855 B1 * | 1/2004 | Gemmell | ..................... | 714/752 |
| 6,724,737 B1 * | 4/2004 | Boyden et al. | ............... | 370/316 |
| 6,847,817 B2 * | 1/2005 | Hadinger et al. | ............ | 455/430 |
| 7,020,823 B2 * | 3/2006 | Bushmitch et al. | .......... | 714/752 |
| 7,047,456 B2 * | 5/2006 | Jutzi | .......................... | 714/712 |
| 2002/0069038 A1 | 6/2002 | Cooper | | |
| 2003/0046633 A1 * | 3/2003 | Jutzi | .......................... | 714/774 |
| 2003/0171934 A1 * | 9/2003 | Zhang et al. | ................. | 704/500 |
| 2005/0207345 A1 * | 9/2005 | Onggosanusi et al. | ........ | 370/236 |

* cited by examiner

*Primary Examiner*—Sam Rizk

(57) ABSTRACT

A system and method for adaptive error correction that optimizes bandwidth by taking into account expected, or predicted, interferences. The bandwidth used for error correction is applied judiciously based on the value of the content and the need to receive the content the first time it is broadcast. The present invention further applies local optimizations in the case of spot-beam satellite broadcasts. As each spot corresponds to a particular geographic region, different input parameters may be used, thereby maximizing efficiency.

23 Claims, 2 Drawing Sheets

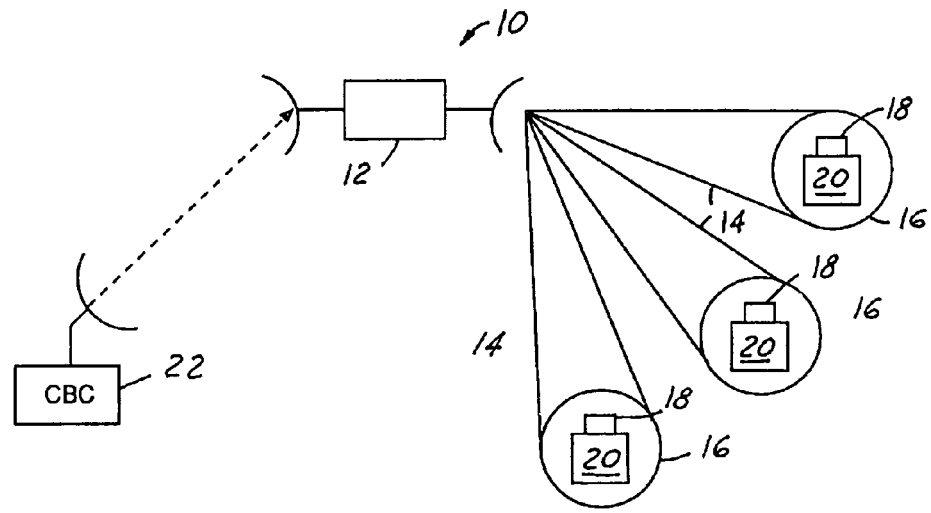
(Prior Art)
FIG. 1
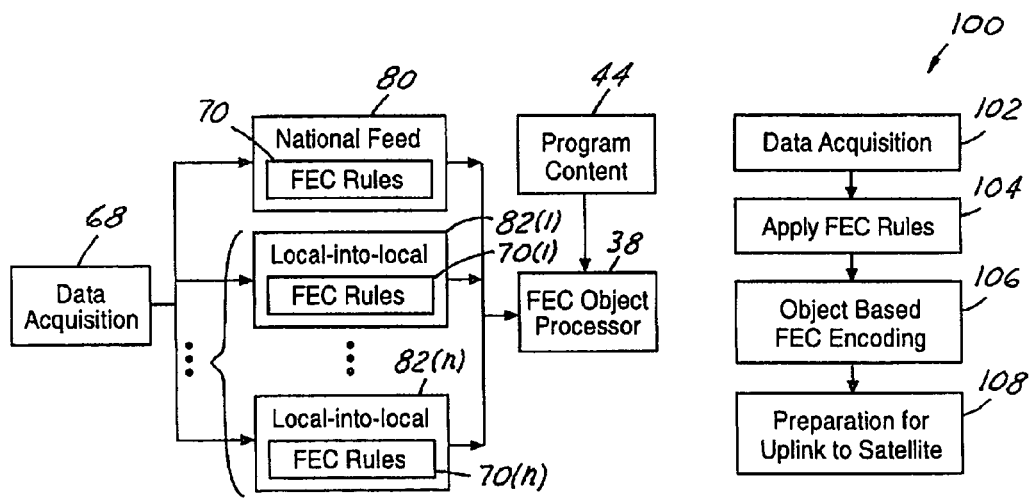
FIG. 3
FIG. 4

ADAPTIVE ERROR CORRECTION

TECHNICAL FIELD

The present invention relates generally to error correction of content broadcast over a satellite network and more particularly to adaptive error correction.

BACKGROUND OF THE INVENTION

Digital communications systems utilize communication channels over which data is transmitted. The communications channels typically have limited bandwidth and finite channel capacity. The channel capacity together with other properties of the channel, such as various forms of noise and interference, will, with statistical certainty, cause or otherwise result in the injection of error conditions in the traffic data communicated over the channel.

A technique for eliminating, or at least reducing, the effect of error conditions is called Forward Error Correction (FEC). In general, the employment of an FEC technique entails transmitting error detection data and error correction data along with the bearer data. The error detection and correction data are typically derived from the bearer data itself by employing an error detection algorithm and error correction algorithm known to the receiver as well as the transmitter.

Unfortunately, the transmission bandwidth available to a user transmitting in a particular time slot in known systems is reduced by the overhead required to transmit the error correction data. To further complicate the error correction process, the transmission bit rate is not fixed, but depends on dynamically varying conditions, such as the relative distance between a remote station and a central station, interference, environmental conditions, data transmission rate, and other conditions too numerous to mention herein.

As a result, the bit error rate of data transmitted between a central station and a remote station varies with each remote station and with time with respect to each remote station, making it difficult to systematically select an FEC error correction algorithm that optimizes both the transmission overhead and error protection capability. In the prior art, the error correction algorithm is typically selected based on a worst-case bit error rate, and is therefore overly robust for most situations, resulting in inefficient use of valuable bandwidth.

There is a need for error correction that can be optimized based on varying conditions, such as weather, the value of the content being transmitted, and local conditions for individual spot beams in a satellite broadcast.

SUMMARY OF THE INVENTION

The present invention is a method and system for adaptive error correction that optimizes bandwidth by taking into account expected, or predicted, interferences. The bandwidth used for error correction is applied judiciously based on the value of the content and the need to receive the content the first time it is broadcast. The present invention further applies local optimizations in the case of spot-beam satellite broadcasts. As each spot corresponds to a particular geographic region, different input parameters may be used, thereby maximizing efficiency.

According to the present invention, the broadcast system allows for services to provide a set of business rules for broadcast and client parameters. One such set of rules is the amount, if any, of Forward Error Correction (FEC) to be applied to data. For example, a high-value object that is broadcast more than once may increase the amount of FEC as it nears the end of the carousel cycle to improve the likelihood of reception. Also, the same object broadcast from different spot beams would use different rules to optimize for local conditions such as weather. The present invention has the capability of receiving feedback from dynamic sources of input, such as weather reports. The system utilizes this data to adapt the object broadcast in order to maximize the competing goals of bandwidth utilization and the probability of reception.

It is an object of the present invention to optimize bandwidth used for error correction by taking into account expected interferences. It is another object of the present invention to judiciously apply the bandwidth used for error correction based on the value of the content and the need to receive the content the first time it is broadcast. It is still another object of the present invention to apply local optimizations in the case of spot beam satellite broadcasts.

Other objects and advantages of the present invention will become apparent upon reading the following detailed description and appended claims, and upon reference to the accompanying drawings.

BRIEF DESCRIPTION OF THE DRAWINGS

For a more complete understanding of this invention, reference should now be had to the embodiments illustrated in greater detail in the accompanying drawings and described below by way of examples of the invention. In the drawings:

FIG. 1 is a satellite system having spot beam transmissions;

FIG. 3 is a block diagram of the object based application of the present invention; and FIG. 4 is a flow chart of the method of the present invention.

DETAILED DESCRIPTION OF PREFERRED EMBODIMENTS

Figure 2:
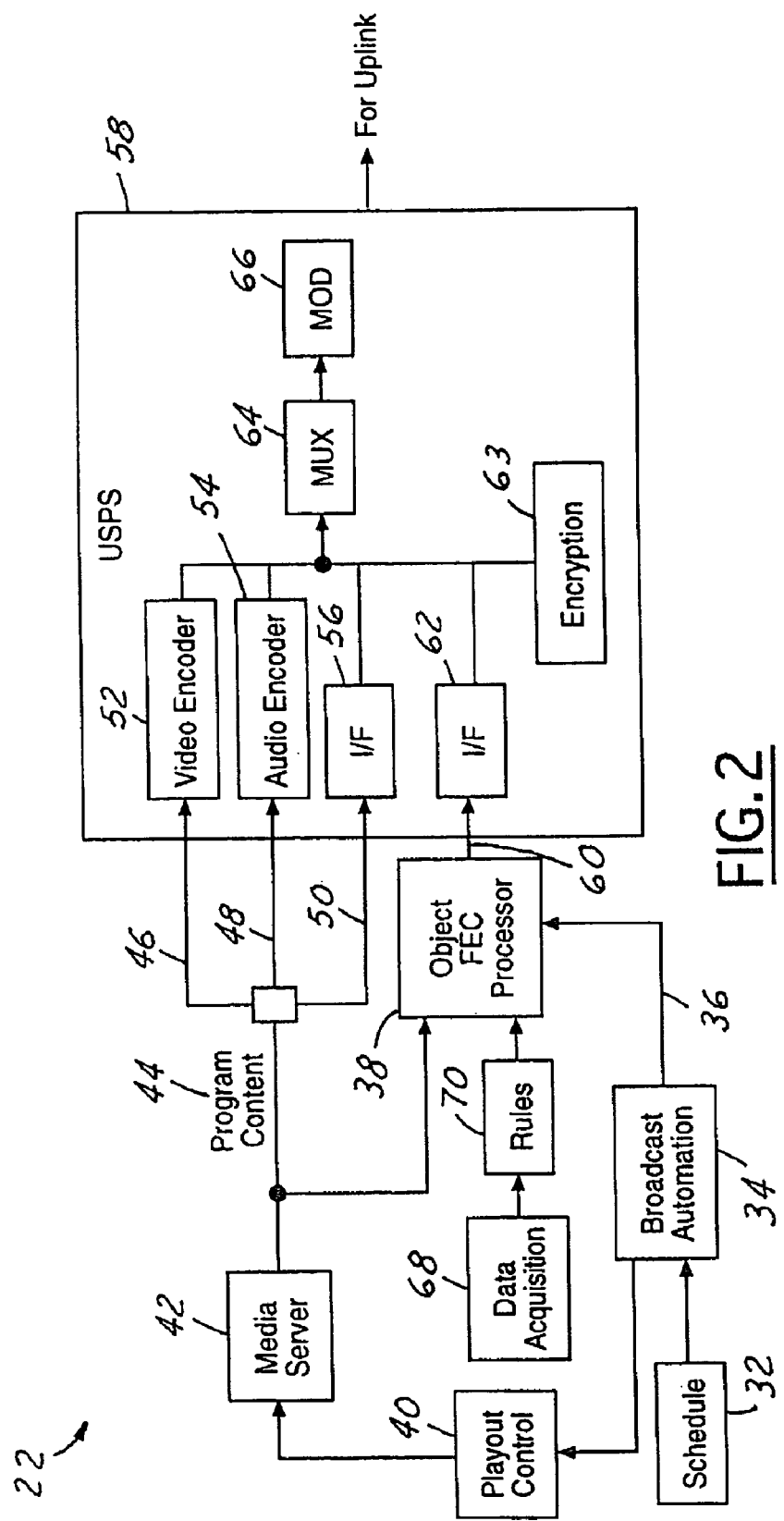
FIG. 2 is a block diagram of a broadcasting system of the present invention.

The present invention presents a method for optimizing bandwidth used for error correction by taking into account expected interferences when scheduling and applying forward error correction to data transmissions. The present invention is described herein with reference to a satellite broadcast system having spot beam transmissions to remote sites. It should be noted however, that the present invention is applicable to systems not shown in FIG. 1 and one skilled in the art is capable of applying the present invention without departing from the scope of the claims hereinafter.

FIG. 1 is a typical spot beam satellite system 10 wherein at least one satellite 12 transmits spot beams 14 to a plurality of remote sites 16. Each site has customer locations each having integrated receiver/decoders 18 that receive the satellite transmissions and decode the transmissions, typically for television 20 viewing. It should be noted that for clarity in the figure, only one customer location is shown in FIG. 1, but typically there are several customers within each spot beam remote site 16. The satellite 12 accepts signals for transmission from a central broadcasting site 22. The spot beams 14 are each directed to a particular remote site 16, each being in its own specific geographic region. The spot beams 14 shown do not overlap but it should be noted that they may or may not overlap in practice depending on the design of the satellite system.

Referring now to FIG. 2 there is shown the scheduling, error correction, and signal processing that takes place at the broadcast facility 22 in preparing the signals for satellite transmission to the remote sites according to the present invention. A master scheduler 32 provides a programming schedule to a broadcast automation system 34. The broadcast automation system 34 executes the schedule and forwards process control information 36 to an object FEC processor 38. The schedule provided by the scheduler 32 is also used by the broadcast automation system 34 to send a playout control 40 to a media server 42. The media server 42 outputs program content 44 in video data 46, audio data 48 and interactive data 50. The data components 46, 48, 50 are sent to respective encoders 52, 54 and data interface 56 in an uplink signal processing system 58 (USPS). The program content 44 is also provided to the object FEC processor 38. The value of the program content depends on the priority assigned by the broadcast facility and is one of many factors used by the present invention in determining the bandwidth to be used for error correction. The higher the priority of the data, the more bandwidth will be assigned for error correction to ensure the data is broadcast properly.

Output 60 of the object FEC processor 38 is provided to a data interface 62 in the USPS 58 and an FEC data object 60 is created. The data streams 46, 48, 50, 60 are processed, along with other data content that may be either necessary or desired. The processed signals are encrypted 63 and sent to a multiplexer 64. A modulator 66 prepares the multiplexed signal for uplink to a satellite system such as the one shown in FIG. 1.

The broadcast system 22 allows for services to provide a set of business rules for broadcast and client parameters. The business rules include, but are not limited to the amount, if any, of forward error correction that is applied to the data. The parameters themselves may change over time. Therefore, the present invention uses feedback from dynamic sources of input to adapt object broadcast and maximize the competing goals of bandwidth utilization and probability of reception.

According to the present invention, the error correction applied to content that is broadcast over a satellite network may be varied adaptively based on any number of active parameters and can be tailored to discrete schedule items or objects of the broadcast. An active parameter is a dynamic parameter, which is, in other words, a parameter that is always changing. For example, time of day, bit rate, atmospheric interference, and the value, or priority, of the broadcast content are all active parameters that can target specific items in a signal containing multiple items. The present invention also uses static parameters, or parameters that are not constantly changing, such as the spot-beam region. The broadcast system 22 considers a set of inputs in order to maximize the efficiency of the satellite bandwidth. The inputs include feedback from the dynamic parameters along with data from the static parameters The data, both static and dynamic, is collected by the present invention and used in order to apply forward error correction to each data object.

Referring still to FIG. 2, data is acquired 68 from the various sources that affect the error correction parameters used in the forward error correction algorithms. This data 68 is applied to one or more sets of rules 70 that are used by the FEC object processor in applying error correction to the targeted schedule item. The present invention uses the data in the set of rules to adapt the error correction on an object broadcast basis. As described above, the set of parameters may change over time. For instance, a high-value object that is broadcast more than once may increase the amount of FEC as it nears the end of the carousel cycle to improve the likelihood of reception. Also, the same object broadcast from different spot beams would use different rules to optimize for local conditions, such as weather patterns or current weather conditions, of the geographic region a particular spot beam is directed to.

The schedule contains information on the specific broadcast content for a specific region and that schedule is communicated to the object FEC processor where the applicable set of rules is applied in order to determine the necessary error correction.

FIG. 3 shows a schematic representation of functional blocks of an adaptive FEC system of the present invention. Like reference numbers in FIGS. 2 and 3 represent like elements in the figures. Referring to FIG. 3, the national broadcast 80 and each local-into-local broadcast block, 82(1) to 82(n), has its own independent set of FEC rules, 70, 70(1) to 70(n). These rules are fed into the FEC object processor 38 to maximize the utilization of the available bandwidth. Further, the FEC rules 70, 70(1), to 70(n) are updated by the data acquisition system 68. This further enhances the localized optimization of the present invention.

The present invention provides several advantages over known methods of error correction. The bandwidth used for error correction is optimized to account for expected interferences. For example, if there are substantially shorter outages from rain during late night hours, less error correction is applied relative to the afternoon when rain storms are more prevalent and last longer.

Another advantage of the present invention is that the bandwidth used for error correction can be applied judiciously based on a predetermined value of the broadcast content and the priority of the need to receive the content the first time it is broadcast. For example, data that must be received during the first time it is broadcast would require more error correction than data that has a lower priority and whose broadcast can be delayed or rebroadcast.

In yet another advantage of the present invention local optimizations may be applied in the case of spot-beam satellite broadcasts. Each spot corresponds to a particular geographic region. Therefore, different input parameters may be used for each region, further maximizing efficiency.

FIG. 4 is a flow chart of the method 100 of adaptive error correction according to the present invention. Adaptive data and parameter information is collected 102 by a data acquisition system. The data and parameters may include, but are not limited to, time of day, targeted region, bit rate, average or worst case atmospheric interference, the value of the program content, the number of expected broadcasts of the program content, among others too numerous to mention herein. The data acquisition may also be dependent upon a particular region associated with a particular spot beam in a spot beam satellite system. Therefore, with the present invention, it is possible to tailor the atmospheric interference expectations, as well as program content, etc. based on the particular region being broadcast to by a particular spot beam.

The acquired data is used 104 by a set of FEC rules that are also tailored to a particular region, either national or one of several local regions. The rules are used to determine the weight to apply to each variable in the applicable FEC algorithm. This allows customization of the error correction applied to each object being broadcast on an individual basis.

According to the present invention, there are multiple FEC algorithms that apply to each spot beam and/or object. Therefore, it is possible to customize the error correction on an object basis 106 according to many specific details regarding the broadcast. The error correction can be applied on an as-needed basis as opposed to being blindly applied on an overly cautious basis, as was previously done in prior art methods. The correction data is then prepared for uplink 108 to the satellite system. The present invention is advantageous in that bandwidth is utilized more efficiently as it is free from being used by excess error correction.

The invention covers all alternatives, modifications, and equivalents, as may be included within the spirit and scope of the appended claims.

What is claimed is:

1. A system for implementing an adaptive forward error correction (FEC) technique, said system comprising:
at least one satellite;
a broadcast facility having a server with program content and a system for preparing signals including said program content for uplink to each said satellite, said program content including both audio and video data; and
an adaptive forward error correction system at said broadcast facility for also preparing said signals for uplink to each said satellite, said adaptive forward error correction system including;
an object FEC processor that is operable to determine an amount of forward error correction according to said program content and also include said amount of forward error correction with said audio and video data of said program content so as to prepare said signals for uplink to each said satellite; and
wherein program content is broadcast more than once and according to a carousel cycle and the amount of forward error correction is further determined according to the carousel cycle.

2. The system as claimed in claim 1, wherein said server is a media server that is operable to assign a priority to said program content to be broadcast, and said object FEC processor is operable to use said priority in determining said amount of forward error correction.

3. The system of claim 2, wherein first program content having a first priority is assigned more error correction bandwidth than second program content having a second priority if the first priority is higher than the second priority.

4. The system as claimed in claim 1, wherein at least one said satellite is a spot-beam satellite.

5. The system as claimed in claim 4, wherein said system further comprises a data acquisition system for collecting data on parameters that may affect the transmission of said signals to or from said spot-beam satellite, said object FEC processor is further operable to determine said amount of said forward error correction according to said parameters data, and at least one of said parameters specifically relates to the spot beam that is transmitted from said spot-beam satellite.

6. The system as claimed in claim 1, wherein said system further comprises a data acquisition system for collecting data on parameters that may affect the transmission of said signals to or from each said satellite, and said object FEC processor is further operable to determine said amount of said forward error correction according to said parameters data.

7. The system as claimed in claim 6, wherein said broadcast facility has a set of FEC rules for application to said parameters data, and said set of FEC rules includes a set of rules for national broadcasts and a set of rules for local broadcasts.

8. The system as claimed in claim 6, wherein said parameters include weather conditions.

9. The system as claimed in claim 6, wherein at least one of said parameters is the time of day.

10. The system as claimed in claim 6, wherein at least one of said parameters is geographic region.

11. The system of claim 1, wherein the amount of forward error correction is further determined to increase the amount of FEC as the program content nears an end of the carousel cycle.

12. A method for applying an adaptive error correction technique to a signal for uplink to a satellite broadcast system, said method comprising the steps of:
providing program content including both audio and video data to an object error-correction processor, said program content having a priority value assigned thereto;
acquiring data on parameters that may affect the transmission of said signal via said satellite broadcast system;
operating said object error-correction processor to determine an amount of error correction according to said priority value of said program content and also said parameters data;
operating said object error-correction processor to include said amount of error correction with said audio and video data of said program content so as to prepare said signal for uplink to said satellite broadcast system; and
wherein program content is broadcast more than once and according to a carousel cycle and the amount of forward error correction is further determined according to the carousel cycle.

13. The method as claimed in claim 12, wherein said satellite broadcast system has a national broadcast and a plurality of local broadcasts, and said method further comprises the step of applying a set of error-correction rules for each of said national broadcast and said local broadcasts independently whereby each of said national broadcast and said local broadcasts has its own set of rules to an error-correction factor for each broadcast.

14. The method of claim 12, wherein the object error-correction processor further determines the amount of error correction to increase the amount of FEC as the program content nears the end of the carousel cycle.

15. The method of claim 12, wherein first program content having a first priority value is assigned more error correction bandwidth than second program content having a second priority value if the first priority is higher than the second priority.

16. A method for customizing error correction being independently applied to individual broadcast objects in a signal for uplink to a spot-beam satellite system, said method comprising the steps of:
assigning a priority value to program content to be broadcast by said spot-beam satellite system, said program content including both audio and video data;
collecting data supplied by a plurality of sources for parameters that may affect the transmission of said individual broadcast objects via said spot-beam satellite system;
applying said parameters data to a plurality of rule sets, each of said rule sets corresponding to an individual broadcast object;
determining an error correction factor for each said individual broadcast object based on said priority value of said program content and also said rule sets with said parameters data applied thereto; and
assigning bandwidth for error correction to be independently applied to each said broadcast object based on said determined error correction factor; and
wherein program content is broadcast more than once and according to a carousel cycle and the amount of forward error correction is further determined according to the carousel cycle.

17. The method as claimed in claim 16, wherein said method further comprises the step of adapting said bandwidth on an object basis.

18. The method as claimed in claim 16, wherein the step of assigning bandwidth for error correction is at least partially accomplished by assigning more bandwidth for error correction to higher priority program broadcasts than to lower priority program broadcasts.

19. The method as claimed in claim 16, wherein the step of assigning bandwidth for error correction is at least partially accomplished by assigning more bandwidth for error correction to a predetermined spot-beam region based on error correction factors for said predetermined spot-beam region.

20. The method as claimed in claim 16, wherein said plurality of sources supplying data for collection is selected from the list consisting of a geographic region, a weather pattern, current weather conditions, expected weather conditions, time of day, said priority value of said program content, average atmospheric interference, worst case atmospheric interference, and number of times said program content is to be broadcast.

21. A system for implementing an adaptive forward error correction (FEC) technique, said system comprising:
- at least one spot-beam satellite;
- a broadcast facility having a server with program content and a system for preparing object-based signals including said program content for uplink to each said spot-beam satellite, said program content including both audio and video data;
- a data acquisition system for collecting data on parameters that may affect the transmission of said object-based signals to or from said spot-beam satellite; and
- an object FEC processor that is operable to determine an amount of forward error correction according to both said program content and said parameters data and also include said amount of forward error correction with said audio and video data of said program content so as to prepare said object-based signals for uplink to each said spot-beam satellite;
- wherein the program content is broadcast more than once according to a carousel cycle, and the object FEC processor further determines the amount of error correction according to the carousel cycle.

22. The system as claimed in claim 21, wherein said broadcast facility has a set of FEC rules for application to said parameters data, and said set of FEC rules includes a set of rules for national broadcasts and a set of rules for local broadcasts.

23. The system of claim 21, wherein the program object FEC processor further determines the amount of FEC to increase the amount of FEC as the program nears the end of the carousel cycle.

\* \* \* \* \*